US012721082B2

(12) United States Patent
Oosterlaken et al.

(10) Patent No.: US 12,721,082 B2
(45) Date of Patent: Aug. 25, 2026

(54) GAS INJECTOR ASSEMBLY

(71) Applicant: ASM IP Holding B.V., Almere (NL)

(72) Inventors: Theodorus G.M. Oosterlaken, Oudewater (NL); Kelly Houben, Lubbeek (BE); Herbert Terhorst, Amersfoort (NL); Cornelis Herbschleb, Leiden (NL)

(73) Assignee: ASM IP Holding B.V., Almere (NL)

( * ) Notice: Subject to any disclaimer, the term of this patent is extended or adjusted under 35 U.S.C. 154(b) by 362 days.

(21) Appl. No.: 18/495,323

(22) Filed: Oct. 26, 2023

(65) Prior Publication Data

US 2024/0145262 A1 May 2, 2024

Related U.S. Application Data

(60) Provisional application No. 63/381,390, filed on Oct. 28, 2022.

(51) Int. Cl.

| | |
|---|---|
| ***H01L 21/67*** | (2006.01) |
| ***C23C 16/455*** | (2006.01) |
| ***H01L 21/02*** | (2006.01) |
| ***H10P 14/60*** | (2026.01) |
| ***H10P 72/00*** | (2026.01) |

(52) U.S. Cl.
CPC .... *H10P 72/0402* (2026.01); *C23C 16/45512* (2013.01); *C23C 16/45561* (2013.01); *C23C 16/45574* (2013.01); *C23C 16/45578* (2013.01); *H10P 14/6338* (2026.01)

(58) Field of Classification Search
CPC ........ C23C 16/45512; C23C 16/45561; C23C 16/45574; C23C 16/45578
See application file for complete search history.

(56) References Cited

U.S. PATENT DOCUMENTS

| | | | | |
|---|---|---|---|---|
| 2011/0277681 | A1 | 11/2011 | Arena | |
| 2015/0240359 | A1* | 8/2015 | Jdira | C23C 16/45512 137/561 A |
| 2017/0121818 | A1* | 5/2017 | Dunn | C23C 16/45544 |

OTHER PUBLICATIONS

European Patent Office, Written Opinion, EP Application No. 23205885.9, Mar. 11, 2024. (Year: 2024).*
European Patent Office, European Search Report, EP Application No. 23205885, Mar. 11, 2024. (Year: 2024).*

* cited by examiner

*Primary Examiner* — Victoria K. Hall
(74) *Attorney, Agent, or Firm* — Banner & Witcoff, Ltd.

(57) ABSTRACT

A gas injector assembly and a substrate processing apparatus comprising the gas injector assembly is disclosed. Embodiments of the presently described gas injector assembly comprise a gas injector, a first precursor gas supply conduit and a second precursor gas supply conduit. A size of the first precursor gas supply conduit is larger than the size of the second precursor gas supply conduit.

17 Claims, 3 Drawing Sheets

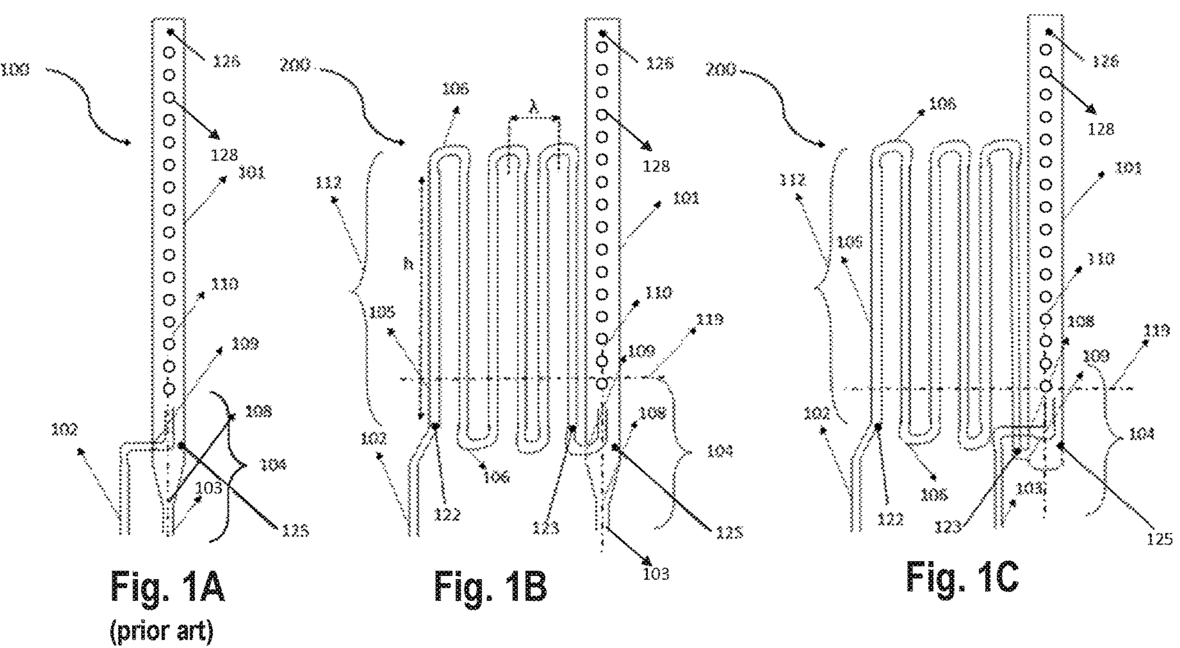
100
126
128
101
110
109
108
104
102
103
125
200
106
λ
112
h
105
119
122
123
Fig. 1A
(prior art)
Fig. 1B
Fig. 1C
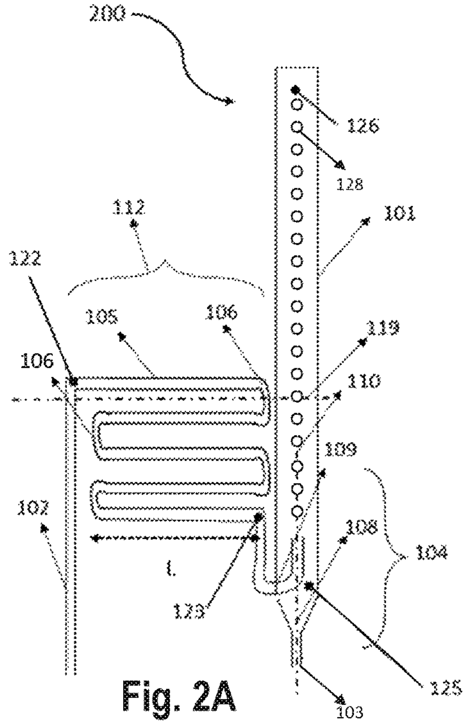
200
126
128
112
101
122
105
106
119
110
109
102
108
104
L
123
125
103
Fig. 2A
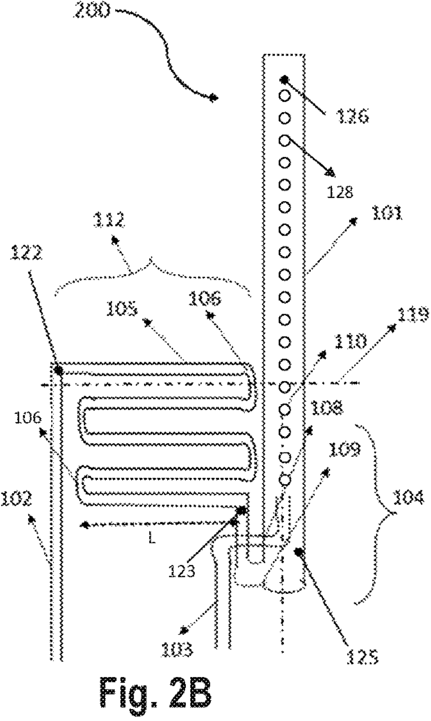
200
126
128
101
112
122
105
106
119
110
108
109
102
104
L
123
103
125
Fig. 2B

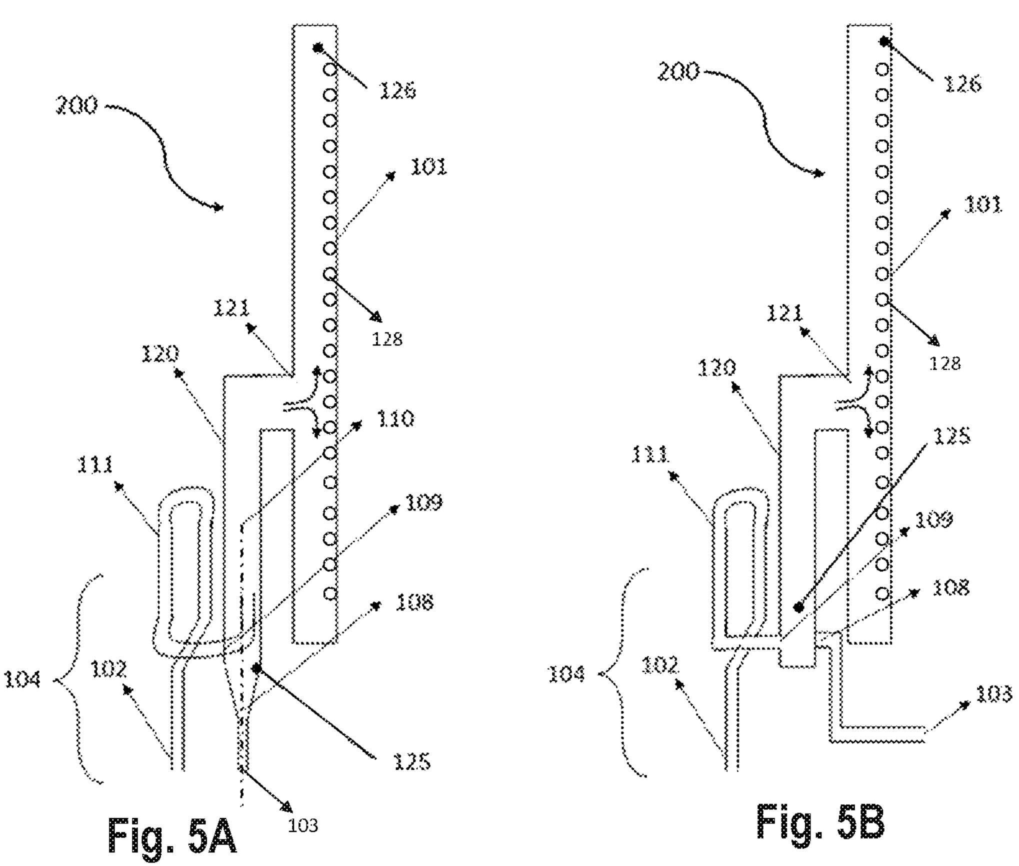
Fig. 5A
Fig. 5B
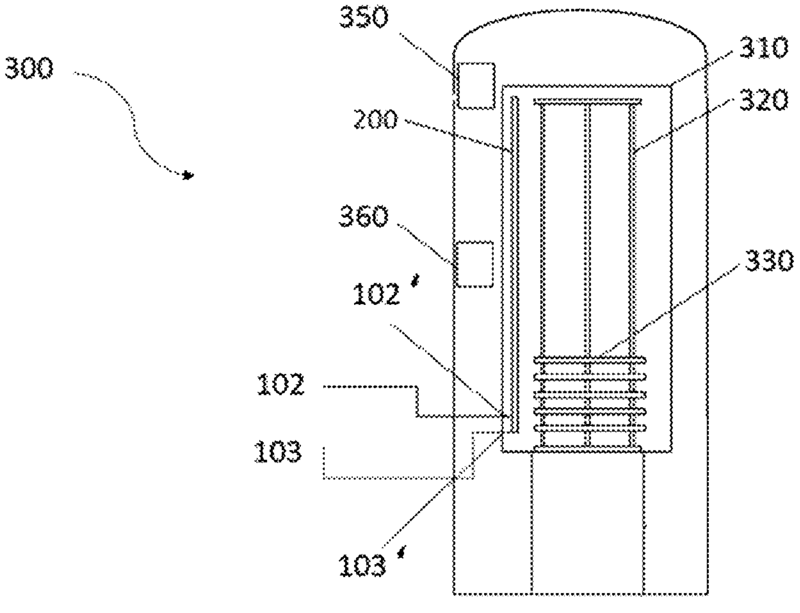
Fig. 6

GAS INJECTOR ASSEMBLY

CROSS-REFERENCE TO RELATED APPLICATION(S)

This application claims the benefit of U.S. Provisional Application 63/381,390 filed on Oct. 28, 2022, the entire contents of which are incorporated herein by reference.

FIELD OF INVENTION

The present disclosure relates to a gas injector assembly. More specifically, it relates to a gas injector assembly for a semiconductor processing apparatus.

BACKGROUND OF THE DISCLOSURE

As the scaling continues in semiconductor industry, improvements in both semiconductor processing and process tools are becoming aligned with the introduction of new device architectures. In that aspect, process performance and process tools may play a significant role on the device performance.

In terms of process performance, precursors may play an important role while they may be posing process challenges. Coupling the right precursor or precursors suitable for the process at hand with the required process tool may help to improve process performance.

For majority of the processes in semiconductor processing, thermal budget may be one of the important considerations. Along with that, enabling a suitable temperature in the process tool that may be required for activating the precursors contributes to those considerations.

In processes where more than one precursor is used, at least one of the precursors may require longer time to become fully activated at the designated process temperature. Furthermore, when mixing of precursors is needed, mixing may also require a certain thermal budget to be activated before contacting the surface of the substrates.

Precursors are typically provided to process chambers of the process tools by using a gas injector. However, current gas injectors may not be capable of enabling full activation of the precursors.

Therefore, there may be a need to provide an improved gas injector for semiconductor processing.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter It may be an object of the present disclosure to provide a gas injector assembly for improving process performance in a semiconductor processing apparatus.

In a first aspect the present disclosure relates to a gas injector assembly for providing a process gas to a process chamber of a semiconductor processing apparatus. The gas injector assembly may comprise a gas injector. The gas injector may comprise an injector tube for injecting a process gas to a process chamber of a semiconductor processing apparatus. The injector tube may extend along a first axis in a longitudinal direction from a first end to a second end. The gas injector may also comprise a feed end that may comprise a first precursor gas inlet and a second precursor gas inlet for providing a first and a second precursor gas to the injector tube to form the process gas. The gas injector assembly may further comprise a first precursor gas supply conduit connecting the first precursor gas inlet to a first precursor gas entry, and a second precursor gas supply conduit connecting the second precursor gas inlet to a second precursor gas entry. A size of the first precursor gas supply conduit extending from the first precursor gas entry to the first precursor gas inlet may be larger than the size of the second precursor gas supply conduit extending from the second precursor gas entry to the second precursor gas inlet.

The gas injector assembly according to embodiments of the first aspect of the present disclosure may allow for improving process performance of a semiconductor processing apparatus.

It may be an advantage of embodiments of the first aspect that preheating of a precursor may be achieved before being exposed to the substrate.

It may be an advantage of embodiments of the first aspect that preheating of a precursor may be achieved before being exposed to another precursor, thus before forming a process gas.

It may be an advantage of embodiments of the first aspect that a precursor requiring longer exposure to the process temperature may get the opportunity to get fully activated before being exposed to the substrate.

It may be an advantage of embodiments of the first aspect that a precursor requiring longer exposure to the process temperature may get the opportunity to get fully activated before being exposed to another precursor, thus, before forming a process gas.

It may also be an advantage of embodiments of the first aspect that substantial mixing of precursors may be achieved before being exposed to the substrate.

It may further be an advantage of embodiments of the first aspect that it may allow for keeping the mixed precursors at the desired temperature of the process.

In a second aspect, the present disclosure relates to a semiconductor processing apparatus for processing a plurality of substrates. The semiconductor processing apparatus may comprise a process chamber extending longitudinally in a vertical direction. It may also comprise a substrate boat being receivable in the process chamber and for holding a plurality of substrates. The apparatus may further comprise a gas injector assembly inside the process chamber, for providing a process gas into the process chamber. The gas injector assembly may comprise a gas injector. The gas injector may comprise an injector tube for injecting the process gas to the process chamber. The injector tube may extend along a first axis in a longitudinal direction from a first end to a second end. The gas injector may further comprise a feed end. The feed end may comprise a first precursor gas inlet and a second precursor gas inlet for providing a first and a second precursor gas to the injector to form the process gas. The gas injector assembly may further comprise a first precursor gas supply conduit connecting the first precursor gas inlet to a first precursor gas entry and a second precursor gas supply conduit connecting the second precursor gas inlet to a second precursor gas entry. A size of the first precursor gas supply conduit extending from the first precursor gas entry to the first precursor gas inlet may be larger than the size of the second precursor gas supply conduit extending from the second precursor gas entry to the second precursor gas inlet.

The semiconductor processing apparatus according to embodiments of the second aspect of the present disclosure may allow for processing of substrates with improved process performance. This may be thanks to the preheating of a precursor before being exposed to the substrate or before being exposed to another precursor. Preheating may allow for activating the precursor.

It may be an advantage of embodiments of the second aspect that it may allow for processing a plurality of substrates at a time with improved processing thanks to preheating of the precursor, thereby increasing process throughput.

It may be an advantage of embodiments of the second aspect that it may enable forming layers on a plurality of substrates having higher quality and improved uniformity thanks to improved precursor activation at the process temperature.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

Like reference numbers will be used for like elements in the drawings unless stated otherwise. Reference signs in the claims shall not be understood as limiting the scope.

FIGS. 1A-1C: A schematic gas injector assembly (FIG. 1A) state of the art, (FIG. 1B) with the first precursor gas supply conduit having longitudinally aligned loops and extending until a central axis of the feed end, (FIG. 1C) with the first precursor gas supply conduit having longitudinally aligned loops and entering to the feed end at another position.

FIGS. 2A-2B: A schematic gas injector assembly (FIG. 2A) with the first precursor gas supply conduit having horizontally aligned loops and extending until a central axis of the feed end, (FIG. 2B) with the first precursor gas supply conduit having horizontally aligned loops and entering to the feed end at another position.

FIGS. 3A-3B: A schematic gas injector assembly (FIG. 3A) with the first precursor gas supply conduit having a circular-shaped concentric loops and extending until a central axis of the feed end, (FIG. 3B) with the precursor gas conduit having a spiral-shape looping downwards and extending until a central axis of the feed end.

FIGS. 4A-4C: A schematic gas injector assembly (FIG. 4A) with the first precursor gas supply conduit having a horse-shoe shaped loop and extending until a central axis of the feed end, (FIG. 4B) with the precursor gas conduit having a horse-shoe shaped loop and entering to the feed end at another position, (FIG. 4C) with precursor gas inlets and precursor gas conduits facing each other at the fed end.

FIGS. 5A-5B: A schematic gas injector assembly (FIG. 5A) with a mixing compartment and with a precursor gas conduit having a horse-shoe shaped loop and extending until a central axis of the feed end and (FIG. 5B) with a mixing compartment and precursor gas inlets and precursor gas conduits facing each other at the feed end.

FIG. 6: A schematic semiconductor processing apparatus.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub-combinations of the various processes, systems, and configurations, and other features, functions, acts, and/or properties disclosed herein, as well as any and all equivalents thereof.

Reference throughout the specification to "embodiments" in various places are not necessarily all referring to the same embodiment, but may. Furthermore, the particular features, structures or characteristics maybe combined in any suitable manner, as would be apparent to one of the ordinary skill in the art from the disclosure, in one or more embodiments.

Reference throughout the specification to "some embodiments" means that a particular structure, feature or step described in connection with these embodiments is included in some of the embodiments of the present invention. Thus, phrases appearing such as "in some embodiments" in different places throughout the specification are not necessarily referring to the same collection of embodiments, but may.

The following terms are provided only to help in the understanding of the disclosure.

As used herein and unless provided otherwise, the term "substantially bowed" may refer to portions being curved such that they can connect longitudinal portions that are parallel to one another and at a certain distance from one another.

As used herein and unless provided otherwise, the term "a size of the first precursor gas supply conduit being larger than the size of the second precursor gas supply conduit" may refer to the first precursor gas supply conduit being longer than the second precursor gas supply conduit or having a larger inner diameter than the second precursor gas supply conduit or both.

As used herein and unless provided otherwise, the term "path length" may refer to the distance travelled by the precursor gas in the process chamber before reaching the gas injector assembly.

As used herein and unless provided otherwise, the term "meander wavelength" may refer to the distance between successive crests of substantially bowed portions of the at least portion.

As used herein and unless provided otherwise, the term "pitch" may refer to the sum of the diameter of one of the process gas injection holes and the spacing between that process gas injection hole and an adjacent one.

As used herein and unless provided otherwise, the term "collinear" may refer to the gas injection holes lying in the same straight line.

As used herein and unless provided otherwise, the term "thermal activation" may refer to the phenomenon occurring when the precursor is heating up. Then the molecules are interacting with each other, thus either giving the molecules more thermal energy or the molecules react internally or the molecules fall apart.

As used herein and unless provided otherwise, the term "bracing" may refer to a kind of bridge-structure constructed in between the elongated portions, thereby connecting them to one another, thus providing support and reducing the risk for breakage, bending, buckling or cracking.

The disclosure will now be described by a detailed description of several embodiments of the disclosure. It is clear that other embodiments of the disclosure can be configured according to the knowledge of persons skilled in the art in the absence of departure from the technical teaching of the disclosure. The disclosure is limited only by the terms of the claims included herein.

We now return to FIGS. 1A-1C showing a gas injector assembly.

FIG. 1A shows schematically a state-of-the-art gas injector assembly (100).

FIG. 1B and FIG. 1C shows schematically a gas injector assembly (200) according to embodiments of the first aspect of the present disclosure.

Figures 3A, 3B, 4A, 4B, 4C:
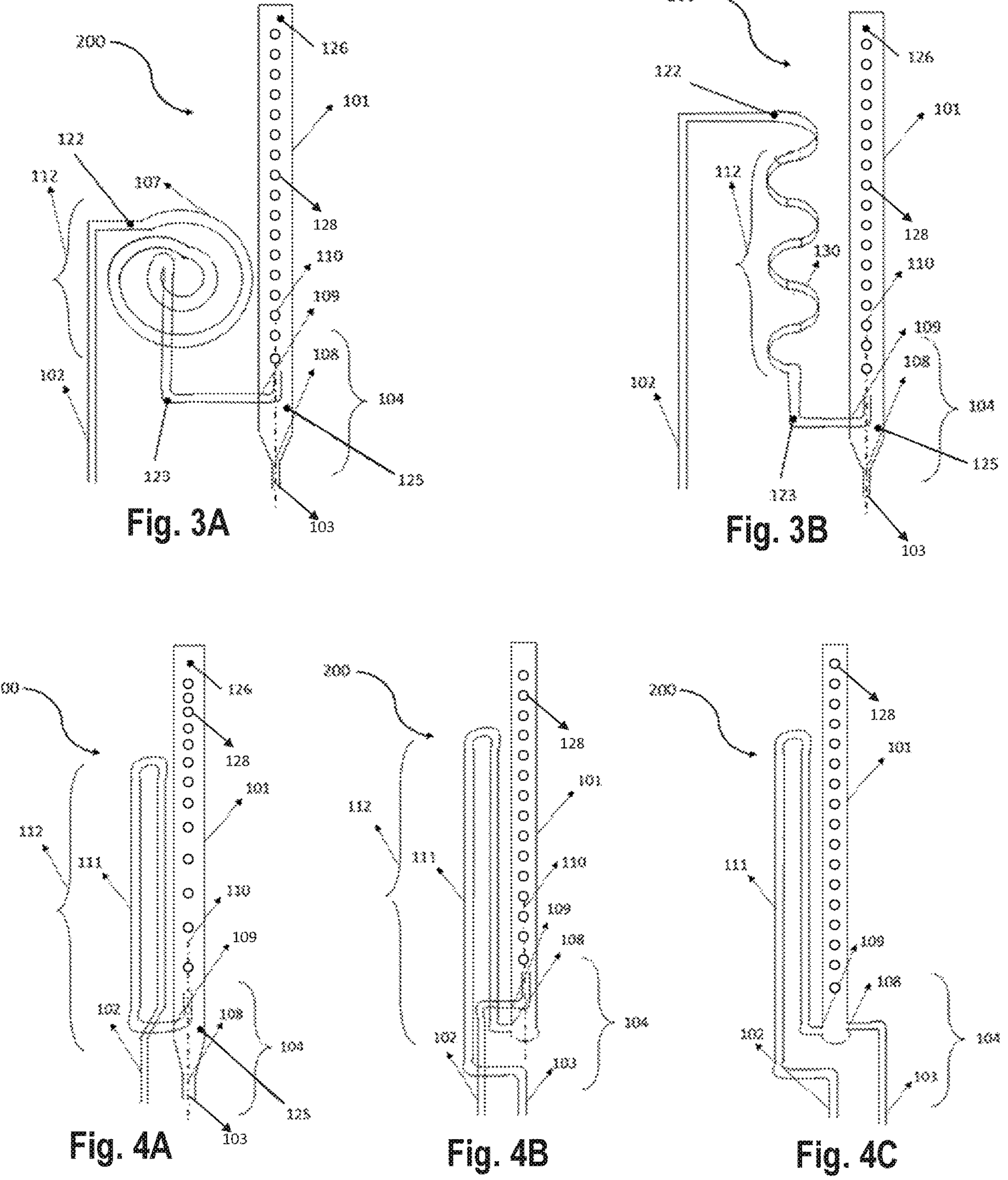

The gas injector assembly may comprise a gas injector. The gas injector may comprise an injector tube (101) extending along a first axis (110) in a longitudinal direction from a first end (125) to a second end (126). The injector tube (101) may be suitable for injecting a process gas to a process chamber of a semiconductor processing apparatus. The gas injector may have a feed end (104) located towards the first end (125) of the injector tube (101). The feed end (104) may comprise a first precursor gas inlet (109) for providing a first precursor gas to the injector tube and a second precursor gas inlet (108) for providing a second precursor gas to the injector tube (101). The first precursor gas and the second precursor gas may form the process gas.

In embodiments, the gas injector may be configured and arranged for mixing the first precursor gas and the second precursor gas, thereby forming the process gas. Thus, mixing may be provided in the gas injector. This may provide the advantage for bringing the process gas to thermal stability before being injected to the process chamber through the injector tube (101). Bringing the process gas to thermal stability may refer to attaining the process temperature for the process gas before it is being injected into the process chamber.

In some embodiments, the gas injector may be configured and arranged for mixing the first precursor gas and the second precursor gas in the injector tube (101).

In some embodiments, the gas injector may be configured and arranged for mixing the first precursor gas and the second precursor gas in the mixing compartment (120) (FIGS. 5A-5B).

In embodiments, at least one of the first precursor gas and the second precursor gas may be provided to the injector tube (101) using a carrier gas. It is to be understood that the provision of the precursor gas to the injector tube (101) using a carrier gas may depend on the type of the film formed on the surface of the substrates. For example, for the formation of a layer of tetra ethyl ortho silicate (TEOS), provision of the precursor may be done in the absence of the carrier gas.

In some embodiments, the first end (125) of the injector tube (101) may be the end comprising the feed end (104) and the second end (126) may be the end extending away from the feed end (104) along the first axis (110) in the longitudinal direction.

In embodiments, the longitudinal direction may be a vertical direction. Therefore, in embodiments, longitudinally aligned may refer to vertically aligned.

In some embodiments, the first precursor gas inlet (109) may be located at a side wall of the feed end (104) and may be in in direct communication with the feed end (104), while the second precursor gas inlet (108) may be located at a distal end of the feed end (104) and may be in direct communication with the feed end (104) as schematically shown in FIG. 1B.

In some embodiments, the second precursor gas inlet (108) may be located at a side wall of the feed end (104) and may be in in direct communication with the feed end (104), while the first precursor gas inlet (109) may be located at a distal end of the feed end (104) and may be in direct communication with the feed end (104) (not shown in the figures).

In some embodiments, both the first precursor gas inlet and the second precursor gas inlet may be located at a side wall of the feed end (104) and may be in direct communication with the feed end (104). In these embodiments, both the first precursor gas inlet (109) and the second precursor gas inlet (108) may be spaced apart from each other along the first axis in the longitudinal direction.

In some of these embodiments, the second precursor gas inlet (108) may be located on the sidewall of the feed end extending away from the first precursor gas inlet (109) along the first axis in the longitudinal direction as schematically shown in FIG. 1C.

In some of these embodiments, the first precursor gas inlet (109) may be located on the sidewall of the feed end extending away from the second precursor gas inlet (108) along the first axis in the longitudinal direction (not shown in the figures).

The gas injector assembly (200) may further comprise a first precursor gas supply conduit (102) connecting the first precursor gas inlet (109) to a first precursor gas entry and a second precursor gas supply conduit (103) connecting the second precursor gas inlet (108) to a second precursor gas entry.

In embodiments, the first and the second gas entry may refer to the entry points of each of the precursor gases into the respective conduits. Thus, the entry point of each of the precursor gas may be located outside the semiconductor processing apparatus. The entry points may thus be the point where each of the precursor gas conduits is connected to a precursor storage. In some embodiments, the first and the second gas entry may refer to the point of entry of each of the precursor gas supply conduits to the process chamber.

A size of the first precursor gas supply conduit (102) extending from the first precursor gas entry to the first precursor gas inlet (109) may be larger than the size of the second precursor gas supply conduit (103) extending from the second precursor gas entry to the second precursor gas inlet (108). As noted above, the first precursor gas supply conduit (102) having the larger size may extend from the first precursor gas entry to the first precursor gas inlet (109), which may be located at a side wall of the feed end (104) as schematically shown in FIG. 1B and FIG. 1C or it may extend from the first precursor gas entry to the first precursor gas inlet, which may be located at a distal end of the feed end (104) (not shown in the figures).

The larger size of the first precursor gas supply conduit (102) may advantageously allow for pre-heating the first precursor that may be transferred through the first precursor gas supply conduit (102). The pre-heating may occur mainly due to the temperature attained in the process chamber that is needed to carry out the processing. It is to be noted that some precursors may need to be exposed to the process temperature longer than other precursors in order to get activated before forming the process gas as a result of mixing with another precursor or before being injected into the process chamber. The larger size of the first precursor gas supply conduit (102) may thus, improve the exposure of the first precursor to the process temperature.

In some embodiments, the first precursor gas supply conduit (102) extending from the first precursor gas entry to the first precursor gas inlet (109) may be longer in length than the second precursor gas supply conduit (103) extending from the second precursor gas entry to the second precursor gas inlet (108). This may also advantageously provide for pre-heating of the first precursor, while it is being transported in the first precursor gas supply conduit (102) between the first precursor gas entry to the first precursor gas inlet (109). By having the first precursor gas supply conduit (102) longer, the time of exposure of the first precursor gas to the process temperature in the process chamber may be prolonged, thereby enabling also advantageously the pre-heating effect.

In embodiments, at least a portion (112) of the first precursor gas supply conduit (102) may be constructed with a plurality of elongated portions (105) being connected to one another by substantially bowed portions (106) as schematically shown in FIG. 1B and FIG. 1C. This configuration may prolong the length of the first precursor gas supply conduit (102), thereby, allowing extended exposure of the first precursor gas to the process temperature inside the process chamber. This may advantageously lead to improvement in getting the first precursor gas thermally activated, while it is being transported in the at least portion (112).

It is to be noted that a rate of thermal activation of precursor gases may differ from one another. It may take a longer time or a shorter time to thermally activate one precursor relative to another. When such precursors are to be used for forming a layer, it may be advantageous to provide the precursor that needs a longer time of thermal activation through the precursor conduit having the larger size. The precursor conduit having the larger size may, in embodiments, be the precursor conduit that may be longer or the one that may have a larger diameter compared to the other precursor conduit.

In embodiments, the precursor conduit having the larger size may be the one having the plurality of elongated portion (105) and may thus be advantageous to provide the precursor that may need a longer time of thermal activation comparted to the other precursor.

In embodiments, the at least portion (112) may be flush against an inner wall of the process chamber. In view of the dimensions and the shape of the process chamber, this may provide the advantage of reducing the risk for physical contact of the at least portion (112) with the substrate or substrates that are loaded into the process chamber.

In embodiments, the at least portion (112) of the first precursor gas supply conduit (102) may be located inside the process chamber.

In embodiments, the elongated portions (105) may be extending along the first axis (110) in the longitudinal direction. The at least portion (112) may extend between a first end (122) and a second end (123) along a second axis (119), the second axis (119) being perpendicular to the first axis (110) as schematically shown in FIG. 1B and FIG. 1C.

In embodiments, the first end (122) of the at least portion (112) may be the end at which the first precursor gas enters into, in the direction of the flow of the first precursor gas so as to be injected to the process chamber, while the second end (123) may be the end at which the first precursor gas exits the at least portion (112).

Since the elongated portions (105) may be parallel to one another along the first axis (110) in the longitudinal direction, the substantially bowed portions (106) may be connecting these elongated portions to each other once from an upper end and once from a lower end along the first axis (110) (FIG. 1B; FIG. 1C). In other words, each of the substantially bowed portions (106) may be connecting a distal end of an elongated portion, where the first precursor gas may be exiting from, to a distal end of an adjacent elongated portion, where the first precursor gas may be entering into, whereby exit and entry point of the elongated portion may be defined as a function of the flow direction of the first precursor gas in the first precursor gas supply conduit (102).

In embodiments, substantially bowed portions (106) located at the upper end may be helpful in directing the first precursor gas flow, which may come from the lower end towards the upper end along the first axis (110) in the longitudinal direction, from the upper end towards the lower end in an adjacent elongated portion. Similarly, substantially bowed portions (106) located at the lower end may be helpful in directing the first precursor gas flow, which may come from the upper end towards the lower end along the first axis (110) in the longitudinal direction, from the lower end towards the upper end in an adjacent elongated portion.

In embodiments, the at least portion (112) of the first precursor gas supply conduit (102) may be meander-shaped. This may be advantageous as it may provide for increased path length. Furthermore, the meander-shaped portion may be advantageous in making the first precursor gas supply conduit less prone to breakage in addition to making it easy to handle.

In embodiments, the meander-shaped portion may comprise bracing. Bracing may help to stabilize the elongated portions (105) of the meander-shaped at least portion (112). This may provide the advantage of providing support for the elongated portions (105), thereby reducing the risk for mechanical issues. Mechanical issues may have to do with, such as for example, breakage, cracking of the meander-shaped portion (112).

In embodiments, the meander wavelength (λ) (FIG. 1B) may be at least about twice the outer diameter of the first precursor gas supply conduit (102). This may advantageously provide an economic use of the space inside the process chamber for installing the gas injector assembly (200). Furthermore, it may enable improved folding of the elongated portions (105), thereby making up the meander-shape. Additionally, this may provide the advantage of having bracing in between the elongated portions (105) of the meander-shaped portion (112).

In embodiments, a height (h) of the elongated portions (105) may be configured such that the path length of the first precursor gas in the first precursor gas supply conduit (102) can provide improved thermal activation to the first precursor gas under the process temperature in the process chamber before it enters into the injector tube. Furthermore, the height (h) may be configured such that the complexity of the gas injector assembly (200) inside the process chamber may be minimized.

Furthermore, the number of elongated portions (105) may be configured such that the temperature of the first precursor gas at the second end (123) of the first precursor gas supply conduit (102) is higher than that at the first end (122), thereby, also contributing to the improvement of thermal activation of the first precursor gas before it enters into the injector tube (101). The higher temperature at the second end (123) may be due to the fact that the first precursor gas is exposed to the temperature of the process chamber temperature for a longer time before getting injected into the injector tube (101).

Thus, in embodiments, the number of elongated portions (105) or the configuration of the at least portion (112) in terms of its shape may be constructed and arranged such that the total length of the at least portion (112) is enough for the precursor to reach the process temperature and to remain at the process temperature, thereby achieving thermal activation at the process temperature, before reaching the injector tube (101).

In some embodiments, the height (h) of the elongated portions (105) extending along the first axis in the longitudinal direction may be increasing from the first end (122) to the second end (123) (not shown in the figures). In other words, the elongated portions (105) may have increasing height (h) extending away from the first end (122) towards the injector tube (101).

In some embodiments, the height (h) of the elongated portions (105) extending along the first axis in the longitudinal direction may be decreasing from the first end (122) to the second end (123) (not shown in the figures). In other words, the elongated portions (105) may have decreasing height (h) extending away from the first end (122) towards the injector tube (101).

We now return to FIGS. 2A-2B schematically showing a gas injector assembly (FIG. 2A) with the precursor gas conduit having horizontally aligned loops and extending until a central axis of the feed end and (FIG. 2B) with the precursor gas conduit having horizontally aligned loops and entering to the feed end at another position.

In embodiments, the central axis may coincide with or be parallel to the first axis (110).

In embodiments, the elongated portions (105) may be extending along the second axis (119). The at least portion (112) may still extend between a first end (122) and a second end (123), however, the elongated portions (105) may be lined up parallel to one another along the second axis (119) as schematically shown in FIG. 2A and FIG. 2B.

Since the elongated portions (105) may be parallel to one another along the second axis (119), the substantially bowed portions (106) may be connecting these elongated portions to each other once towards the right side of the second axis (119) and once towards the left side of the second axis (119) (FIG. 2A; FIG. 2B). In other words, each of the substantially bowed portions (106) may be connecting a distal end of an elongated portion, where the first precursor gas may be exiting from, to a distal end of an adjacent elongated portion being parallel to it along the first axis (110), where the first precursor gas may be entering into, whereby exit and entry point of the elongated portion may be defined as a function of the flow direction of the first precursor gas in the first precursor gas supply conduit (102).

In embodiments, a length (L) of the elongated portions (105) may be configured such that the path length of the first precursor gas in the first precursor gas supply conduit (102) can provide improved thermal activation to the first precursor gas under the process temperature in the process chamber before it enters into the injector tube (101). Furthermore, the length (L) may be configured such that the complexity of the gas injector assembly (200) inside the process chamber may be minimized.

Furthermore, the number of elongated portions (105) may be configured such that the temperature of the first precursor gas at the second end (123) of the first precursor gas supply conduit (102) is higher than that at the first end (122), thereby, also contributing to the improvement of thermal activation of the first precursor gas before it enters into the injector tube (101). The higher temperature at the second end (123) may be due to the fact that the first precursor gas is exposed to the temperature of the process chamber temperature for a longer time before getting injected into the injector tube (101).

In some embodiments, as schematically represented in FIG. 2A, the first precursor gas inlet (109) for the first precursor gas supply conduit (102) with the elongated portions (105) may be located at a side wall of the feed end (104) and may be in direct communication with the feed end (104), while the second precursor gas inlet (108) for the second precursor gas supply conduit (103) may be located at a distal end of the feed end (104) and may be in direct communication with the feed end (104).

In some embodiments, (not shown in the figures), the second precursor gas inlet (108) for the second precursor gas supply conduit (103) may be located at a side wall of the feed end (104) and may be in direct communication with the feed end (104), while the first precursor gas inlet (109) for the first precursor gas supply conduit (102) with the elongated portions may be located at a distal end of the feed end (104) and may be in direct communication with the feed end (104).

In some embodiments, as schematically represented in FIG. 2B, both the first precursor gas inlet (109) and the second precursor gas inlet (108) may be located at a side wall of the feed end (104) and may be in direct communication with the feed end (104). In these embodiments, both the first precursor gas inlet (109) and the second precursor gas inlet (108) may be spaced apart from each other along the first axis (110) in the longitudinal direction. In these embodiments, the first precursor gas supply conduit (102) or the second gas supply conduit (103) may have the elongated portions (105).

In some embodiments, the second precursor gas inlet (108) may be located on the sidewall of the feed end extending away from the first precursor gas inlet (109) along the first axis in the longitudinal direction as schematically shown in FIG. 2B. In some embodiments, the first precursor gas inlet (109) may be located on the sidewall of the feed end (104) extending away from the second precursor gas inlet (108) along the first axis (110) in the longitudinal direction (not shown in the figures).

Referring to FIG. 3A, in some embodiments, the at least portion (112) of the first precursor gas supply conduit (102) may have circular-shaped concentric loops (107). The circular-shaped concentric loops (107) may be spiraling inward, with reducing diameter, starting from the first end (122) towards the second end (123). The number of concentric loops (107) may be configured such that the temperature of the first precursor gas at the second end (123) of the first precursor gas supply conduit (102) is higher than that at the first end (122), thereby providing improved thermal activation of the first precursor gas. The higher temperature at the second end (123) may be due to the fact that the first precursor gas is exposed to the temperature of the process chamber temperature for a longer time before getting injected into the injector tube (101).

In some embodiments, as schematically represented in FIG. 3A, the first precursor gas inlet (109) for the first precursor gas supply conduit (102) with the circular-shaped concentric loops (107) may be located at a side wall of the feed end (104) and may be in direct communication with the feed end (104), while the second precursor gas inlet (108) for the second precursor gas supply conduit (103) may be located at a distal end of the feed end (104) and may be in direct communication with the feed end (104).

In some embodiments, (not shown in the figures), the second precursor gas inlet (108) for the second precursor gas supply conduit (103) may be located at a side wall of the feed end (104) and may be in direct communication with the feed end (104), while the first precursor gas inlet (109) for the first precursor gas supply conduit (102) with the circular-shaped concentric loops (107) may be located at a distal end of the feed end (104) and may be in direct communication with the feed end (104).

In some embodiments, (not shown in the figures) both the first precursor gas inlet (109) and the second precursor gas inlet (108) may be located at a side wall of the feed end (104) and may be in direct communication with the feed end (104). In these embodiments, the first precursor gas inlet (109) and the second precursor gas inlet (108) may be spaced apart from each other along the first axis (110) in the longitudinal direction. In these embodiments, the first precursor gas supply conduit (102) or the second gas supply conduit (103) may have the circular-shaped concentric loops (107).

In some of these embodiments, the second precursor gas inlet (108) may be located on the sidewall of the feed end (104) extending away from the first precursor gas inlet (109) along the first axis in the longitudinal direction.

In some of these embodiments, the first precursor gas inlet (109) may be located on the sidewall of the feed end (104) extending away from the second precursor gas inlet (108) along the first axis (110) in the longitudinal direction (not shown in the figures).

Referring to FIG. 3B, in some embodiments, the at least portion (112) of the first precursor gas supply conduit (102) may have a spiral shape (130) looping downwards along the first axis in the longitudinal direction. The spiral shape (130) may be spiraling downward, starting from the first end (122) towards the second end (123). The number of turns may be configured such that the temperature of the first precursor gas at the second end (123) of the first precursor gas supply conduit (102) is higher than that at the first end (122), thereby providing improved thermal activation of the first precursor gas. The higher temperature at the second end (123) may be due to the fact that the first precursor gas is thus, exposed to the temperature of the process chamber temperature for a longer time before getting injected into the injector tube (101).

In some embodiments, as schematically represented in FIG. 3B, the first precursor gas inlet (109) for the first precursor gas supply conduit (102) with the spiral shape (130) may be located at a side wall of the feed end (104) and may be in direct communication with the feed end (104), while the second precursor gas inlet (108) for the second precursor gas supply conduit (103) may be located at a distal end of the feed end (104) and may be in direct communication with the feed end (104). The first precursor gas supply conduit (102) may extend until the central axis, which may be coinciding with the first axis (110).

In some embodiments, (not shown in the figures), the second precursor gas inlet (108) for the second precursor gas supply conduit (103) may be located at a side wall of the feed end (104) and may be in direct communication with the feed end (104), while the first precursor gas inlet (109) for the first precursor gas supply conduit (102) with the spiral shape (130) may be located at a distal end of the feed end (104) and may be in direct communication with the feed end (104). The second precursor gas supply conduit (103) may extend until the central axis, which may be coinciding with the first axis (110).

In some embodiments, (not shown in the figures) both the first precursor gas inlet (109) and the second precursor gas inlet (108) may be located at a side wall of the feed end (104) and may be in direct communication with the feed end (104). In these embodiments, the first precursor gas inlet (109) and the second precursor gas inlet (108) may be spaced apart from each other along the first axis (110) in the longitudinal direction. In these embodiments, the first precursor gas supply conduit (102) or the second gas supply conduit (103) may have the spiral shape (130).

In some of these embodiments, the second precursor gas inlet (108) may be located on the sidewall of the feed end (104) extending away from the first precursor gas inlet (109) along the first axis in the longitudinal direction.

In some of these embodiments, the first precursor gas inlet (109) may be located on the sidewall of the feed end (104)

extending away from the second precursor gas inlet (108) along the first axis (110) in the longitudinal direction (not shown in the figures).

In embodiments, the at least portion of the first precursor gas supply conduit (102) may be a horse-shoe shaped meander (111) as schematically represented in FIGS. 4A-4C. This may be advantageous as it can offer efficient use of the space inside the process chamber. Furthermore, it may still provide the path length necessary to provide the desired and improved thermal activation of the first precursor gas before it is injected into the process chamber.

In some embodiments, as schematically represented in FIG. 4A, the first precursor gas inlet (109) for the first precursor gas supply conduit (102) having the horse-shoe shaped meander (111) may be located at a side wall of the feed end (104) and may be in direct communication with the feed end (104), while the second precursor gas inlet (108) for the second precursor gas supply conduit (103) may be located at a distal end of the feed end (104) and may be in direct communication with the feed end (104). The first precursor gas supply conduit (102) may extend until the central axis, which may be coinciding with the first axis (110).

In some embodiments, (not shown in the figures), the second precursor gas inlet (108) for the second precursor gas supply conduit (103) may be located at a side wall of the feed end (104) and may be in direct communication with the feed end (104), while the first precursor gas inlet (109) for the first precursor gas supply conduit (102) with the horse-shoe shaped meander (111) may be located at a distal end of the feed end (104) and may be in direct communication with the feed end (104). The second precursor gas supply conduit (103) may extend until the central axis, which may be coinciding with the first axis (110).

In some embodiments, both the first precursor gas inlet (109) and the second precursor gas inlet (108) may be located at a side wall of the feed end (104) and may be in direct communication with the feed end (104) as schematically shown in FIG. 4B. In these embodiments, the first precursor gas inlet (109) and the second precursor gas inlet (108) may be spaced apart from each other along the first axis (110) in the longitudinal direction. In these embodiments, the first precursor gas supply conduit (102) or the second gas supply conduit (103) may have the horse-shoe shaped meander (111). In these embodiments, the first precursor gas supply conduit (102) or the second gas supply conduit (103) may extend until the central axis, which may be coinciding with the first axis (110).

In some of these embodiments, the second precursor gas inlet (108) may be located on the sidewall of the feed end (104) extending away from the first precursor gas inlet (109) along the first axis in the longitudinal direction (FIG. 4B).

In some of these embodiments, the first precursor gas inlet (109) may be located on the sidewall of the feed end (104) extending away from the second precursor gas inlet (108) along the first axis (110) in the longitudinal direction (not shown in the figures).

In some embodiments, the first precursor gas inlet (109) and the second precursor gas inlet (108) may be located on opposing sides of the feed end (104). In some embodiments, the first precursor gas inlet (109) and the second precursor gas inlet (108) may be facing each other from opposing sides of the feed end (104) (FIG. 4C). This may provide mixing of the first precursor gas and the second precursor gas inside the injector tube (101) upon introduction into the injector tube and before getting injected into the process chamber. Mixing provided already in the injector tube (101) may help form the process gas, thereby improving precursor gas utilization and improving process yield when it is injected into the process chamber.

Location of the first precursor gas inlet (109) and the second precursor gas inlet (108) on opposing sides of the feed end (104) as well as facing each other when positioned on opposing sides of the feed end (104) may be possible with the same advantages when the at least portion (112) of the first precursor gas supply conduit (102) is meander-shaped (FIG. 1B, FIG. 1C, FIG. 2A, FIG. 2B), has circular-shaped concentric loops (107) (FIG. 3A) and has the spiral shape (130) (FIG. 3B).

In embodiments, the first precursor gas inlet (109) and the second precursor gas inlet (108) may be positioned at an angle of 180° or less with respect to one another. Different positioning of the first precursor gas inlet (109) and the second precursor gas inlet (108) may provide advantage on mixing the precursor gases, obtaining thermal stability of the process gas formed When the first precursor gas inlet (109) and the second precursor gas inlet (108) are positioned at an angle of 0° with respect to one another, then they may be located either on the same side of the feed end (104), such as schematically represented in FIG. 1C, FIG. 2B, FIG. 4B, or they may be located on opposing sides of the feed end (104) such as schematically represented in FIG. 4C.

When positioned on the same side of the feed end (104), the first precursor gas inlet (109) and the second precursor gas inlet (108) may be such that one of the precursor gas inlet may be extending away from the other precursor gas inlet parallel to the first axis (110) in the longitudinal direction.

When positioned on opposing sides of the feed end (104) (FIG. 4C), the first precursor gas inlet (109) and the second precursor gas inlet (108) may be facing each other. In embodiments they may be facing each other such that both inlets (108, 109) may be parallel to the second axis (119).

When the first precursor gas inlet (109) and the second precursor gas inlet (108) is positioned at an angle less than 180° with respect to one another, they may advantageously be positioned at an angle of 90° with respect to one another such as schematically represented in FIG. 1B, FIG. 2A, FIG. 3A, FIG. 3B and FIG. 4A. Thus, in some embodiments, the first precursor gas inlet (109) for the first precursor gas supply conduit (102) may be located at a side wall of the feed end (104) and may be in direct communication with the feed end (104), while the second precursor gas inlet (108) for the second precursor gas supply conduit (103) may be located at a distal end of the feed end (104) and may be in direct communication with the feed end (104).

In some embodiments, the second precursor gas inlet (108) for the second precursor gas supply conduit (103) may be located at a side wall of the feed end (104) and may be in direct communication with the feed end (104), while the first precursor gas inlet (109) for the first precursor gas supply conduit (102) may be located at a distal end of the feed end (104) and may be in direct communication with the feed end (104).

In embodiments, the first precursor gas supply conduit (102) or the second precursor gas supply conduit (103) may extend until a central axis of the feed end (104), the central axis maybe coinciding with the first axis (110). This may be schematically represented in FIG. 1B, FIG. 2A, FIG. 3A, FIG. 3B, FIG. 4A, FIG. 4B and FIG. 5A, where the first precursor gas supply conduit (102) may extend until the central axis of the feed end (104). It may also be schematically represented in FIG. 1C and FIG. 2B where the second precursor gas supply conduit (103) may extend until the central axis of the feed end (104). This may provide the advantage of mixing. This may further be advantageous for providing a shielding effect for the inner walls of the injector tube (101). In situations where quick mixing of the precursor gases takes place, this may lead to deposition on the inner walls of the injector tube (101). Therefore, it may be advantageous to have one of the precursor supply conduits extending until the central axis of the feed end (104) so that mixing can occur not in the close vicinity of the inner walls of the injector tube (101).

In embodiments, the first precursor gas supply conduit (102) and the second precursor gas supply conduit (103) may have a cylindrical shape, although other suitable shapes suitable for a conduit may also be possible.

In embodiments, the diameter of the first precursor gas inlet (109) for providing the first precursor gas may be different than the diameter of the second precursor gas inlet for providing the second precursor gas. This may advantageously allow for providing the first precursor gas and the second precursor gas with the required pressure value, if they need to be provided into the gas injector at different pressure values.

In some embodiments, the pressure of the first precursor gas may need to be lower than the pressure of the second precursor gas. Thus, the diameter of the first precursor gas inlet (109) may be larger than the diameter of the second precursor gas inlet (108).

In some embodiments, the pressure of the second precursor gas may need to be lower than the pressure of the first precursor gas. Thus, the diameter of the second precursor gas inlet (108) may be larger than the diameter of the first precursor gas inlet (109).

In line with this, the diameter of the first precursor gas supply conduit (102) for providing the first precursor gas may also be different than the diameter of the second precursor gas supply conduit (103) for providing the second precursor gas. This may thus, be advantageous in order to minimize particle contamination as particle contamination may occur as a result of deposition inside the precursor gas conduits that may be a function of the precursor gas pressure.

In embodiments, where the first precursor gas supply conduit (102) comprises the at least portion (112), it may be advantageous that the diameter of the first precursor gas supply conduit (102) is larger than the diameter of the second precursor gas supply conduit (103). This may allow for sufficient exposure of the first precursor gas to the process temperature while still being inside the first precursor gas conduit (102), thereby improving its thermal activation. This may be particularly advantageous in cases when the first precursor gas needs longer time of exposure to the process temperature before reaching its thermal activation.

Conversely, in embodiments, where the second precursor gas supply conduit (103) comprises the at least portion (112), it may be advantageous that the diameter of the second precursor gas supply conduit (103) is larger than the diameter of the first precursor gas supply conduit (102). This may allow for sufficient exposure of the second precursor gas to the process temperature while still being inside the second precursor gas supply conduit (103), thereby improving its thermal activation. This may be particularly advantageous in cases when the second precursor gas needs longer time of exposure to the process temperature before reaching its thermal activation.

In embodiments, the injector tube (101) may comprise a plurality of process gas injection holes (128) for delivering the process gas into the process chamber and these process gas injection holes (128) may be spaced apart from one another in the longitudinal direction.

In embodiments, the process gas injection holes (128) may be spaced apart from one another along the first axis in the longitudinal direction. In other words, the holes may be constructed and arranged in a collinear fashion in the body of the injector tube (101) along the first axis. This may be advantageous in distributing the process gas to the process chamber. The process gas injection holes (128) may allow for reducing process variations such as for example, thickness uniformity of the film deposited on the surface of the substrates and the composition of the film.

In embodiments, the diameter of each of the process gas injection holes (128) may substantially be the same.

In some embodiments, the diameter of the each of the process gas injection holes (128) may be in a range of 1 mm to 1.5 mm. In these embodiments, the pitch value may be in a range of 20 mm to 35 mm.

In some embodiments, the diameter of the each of the process gas injection holes (128) may be in a range of 4 mm to 6 mm. In these embodiments, the pitch value may be in a range of 15 mm to 200 mm.

In some embodiments, the process gas injection holes (128) may be equally separated from one another along the height of the injector tube (101). In other words, the distance between center points of each of the holes may be the same. Taking into account the fact that in some embodiments the diameter of the process gas injection holes (128) may be substantially the same, this means, in other words, that the pitch value of these injection holes (128) may be constant or may substantially be the same. It is to be understood that for processes with challenging process control requirements, the diameter of the process gas injection holes (128) may be configured differently along said first axis as required. This can enable process control optimization.

In embodiments, the plurality of process gas injection holes (128) may extend along a height of the injector tube (101). As the gas injector may be constructed and arranged to provide the process gas to a plurality of substrates comprised in the substrate boat, whereby the substrate boat is receivable in the process chamber, the presence of the holes along the height of the injector tube (101) may advantageously allow for distributing the process gas in an equilibrated manner to the process chamber and thus, to the plurality of substrates.

In embodiments, a distal end of the substrate boat may preferably be aligned with a distal end of the injector tube (101), the distal end being opposite to the second end (126) along the first axis in the longitudinal direction. The substrate load comprised in the substrate boat may thus, be positioned lower than the distal end of the injector tube (101).

In some embodiments, the pitch of the process gas injection holes (128) may be constant over the height of the injector tube (101).

In some embodiments, the pitch of the process gas injection holes (128) may be changing along the height of the injector tube (101).

Thus, in some embodiments, the plurality of process gas injection holes (128) may have a pitch value decreasing along the first axis in the longitudinal direction from the first end (125) to the second end (126). This means, in other words, taking into account the fact that the diameter of the holes is substantially the same, the distance between the centers of the holes may be decreasing along the first axis in the longitudinal direction from the first end (125) to the second end (126). The pressure inside the main body of the gas injector may be lower near the second end (126) compared to near the first end (125). Thus, the pitch of the process gas injection holes (128) may be smaller towards the second end (126). The higher pressure near the first end (125) may require fewer injection holes (128) in this portion. This means, injection holes (128) having a larger pitch value may be needed in order to get the gas inside the process chamber. Therefore, the difference in the pitch value along the first axis from the first end (125) to the second end (126) may help to accommodate the difference in the pressure of the process gas inside the injector tube (101) of the gas injector, thereby allowing equal amount of gas to be delivered inside the process chamber. This may provide even distribution of the process gas inside the process chamber. In embodiments, where deposition is being carried out on the plurality of substrates in the process chamber, this thereby may allow for achieving uniform film deposition.

It is to be noted that the pitch value may depend on the size of the injector tube (101). When the body of the injector tube (101) is narrow, there may be a steep change in the pitch value of the process gas injection holes (128). This may be to accommodate the high pressure drop inside the injector tube (101). The gas injection holes (128) located near the first end (125) of the injector tube (101) may provide more supply to the process chamber due to high pressure than the gas injection holes (128) located near the second end (126) of the injector tube (101). Therefore, the change in the pitch value of the process gas injection holes (128) may need to be approximately as steep as the pressure gradient inside the injector tube (101).

We now return to FIGS. 5A-5B. In embodiments, the gas injector assembly (200) may further comprise a mixing compartment (120). The mixing compartment (120) may comprise the feed end (104) and the mixing compartment (120) may be connected to the injector tube (101) via a feed entry (121) as schematically shown in FIG. 5A and FIG. 5B.

In embodiments, the mixing compartment (120) may be directly connected to the injector tube (101) via a feed entry (121).

The arrows in FIG. 5A and FIG. 5B represent schematically the flow of the process gas via the feed entry (121) into the injector tube (101).

The presence of the mixing compartment (120) may advantageously allow for mixing of the first precursor gas and the second precursor gas, thereby forming the process gas before being provided into the injector tube (101).

In some embodiments, the first precursor gas supply conduit (102) may be connected to the mixing compartment (120) through the first precursor gas inlet (109) at a side wall of the feed end (104) and may be in direct communication with the feed end (104) and may extend until a central axis of the feed end (104). In these embodiments, the first precursor supply conduit (102) may comprise the at least portion (112). In some embodiments, as schematically represented in FIG. 5A, the at least portion (112) may be the horse-shoe shaped meander (111). In some embodiments, the at least portion (112) may be of any other shape as disclosed in the present disclosure.

The second precursor gas supply conduit (103) may be connected to the mixing compartment (120) through the second precursor gas inlet (108) at a distal end of the feed end (104) and may be in direct communication with the feed end (104), as schematically represented in FIG. 5A.

In some embodiments, (not shown in the figures), the second precursor gas supply conduit (103) may be connected to the mixing compartment (120) through the second precursor gas inlet (108) at a side wall of the feed end (104) and may be in direct communication with the feed end (104), while the first precursor gas supply conduit (102) may be connected to the mixing compartment (120) through the first precursor gas inlet (109) at a distal end of the feed end (104) and may be in direct communication with the feed end (104). In these embodiments, the first precursor supply conduit (102) may comprise the at least portion (112), where the at least portion (112) may be the horse-shoe shaped meander (111) or may be of any other shape as disclosed in the present disclosure.

In some embodiments, both the first precursor gas supply conduit (102) and the second precursor gas supply conduit (103) may be connected to the mixing compartment (120) through the first precursor gas inlet (109) and second precursor gas inlet (108) at a side wall of the feed end (104) and may be in direct communication with the feed end (104) (not shown in the figures). In these embodiments, the first precursor gas inlet (109) and the second precursor gas inlet (108) may be spaced apart from each other along the first axis (110) in the longitudinal direction. In these embodiments, the first precursor gas supply conduit (102) or the second gas supply conduit (103) may have the horse-shoe shaped meander (111). In these embodiments, the first precursor gas supply conduit (102) or the second gas supply conduit (103) may be of any other shape as disclosed in the present disclosure.

In some of these embodiments, the second precursor gas inlet (108) may be located on the sidewall of the feed end (104) extending away from the first precursor gas inlet (109) along the first axis in the longitudinal direction (not shown in the figures).

In some of these embodiments, the first precursor gas inlet (109) may be located on the sidewall of the feed end (104) extending away from the second precursor gas inlet (108) along the first axis (110) in the longitudinal direction (not shown in the figures).

Returning now to FIG. 5B, it is disclosed that in some embodiments, the first precursor gas inlet (109) and second precursor gas inlet (108) may be located on opposing sides of the feed end (104) and they may be facing each other in the mixing compartment (120). The first precursor gas supply conduit (102) and the second precursor gas supply conduit (103) may be connected to the mixing compartment (120) through the first precursor gas inlet (109) and second precursor gas inlet (108).

This may provide mixing of the first precursor gas and the second precursor gas inside the mixing compartment (120). The mixing may help for the formation of the process gas and the process gas formed is then provided to the injector tube (101) through the feed entry (121).

The first precursor gas inlet (109) and the second precursor gas inlet (108) facing the first precursor gas inlet (109) may be located on opposing sides of the mixing compartment anywhere along the first axis in the longitudinal direction.

In embodiments, the mixing compartment (120) may be located below the injector tube (101) (not shown in the figures). This may be advantageous in providing a temperature stabilization to the process gas in the injector tube (101), the process gas being formed after mixing of the precursors in the mixing compartment (120). Furthermore, in processes where a longer path may be needed for the process gas to get thermally activated before being injected to the process chamber, this configuration may provide a further advantage.

In embodiments, the dimensions, such as for example the length, the width and the depth, of the mixing compartment (120) may be configured depending on the mixing length of the precursor gases within the mixing compartment (120). The mixing length may be a function of the positioning of the precursor gas inlets and where the mixing takes place in the mixing compartment (120).

In FIG. 5A, for example, the mixing length is longer since the precursor gas inlets (108, 109) are at 90° to one another and furthermore, one of the precursor supply conduits (102) extends until the central axis (110).

In FIG. 5B, for example, the mixing length is shorter since the precursor gas inlets (108, 109) face each other.

In embodiments, the feed entry (121) may be located near the first end (125) of the injector tube (101) or in between the first end (125) and the second end (126) of the injector tube (101).

In embodiments, where the feed entry (121) is located near the first end (125) of the injector tube (101), improved mixing of the precursor gases may be obtained. This may be due to the fact that one of the precursor gases is provided through the precursor gas conduit having the at least portion (112), thereby becoming thermally activated before entering the mixing compartment (120). After mixing with the other precursor in the mixing compartment (120) and being provided into the injector tube (101) through the feed entry (121), the mixture of the precursor gases may have the advantage of reaching thermal activation in the injector tube (101) before being injected into the process chamber.

In embodiments, where the feed entry (121) is located in between the first end (125) and the second end (126) of the injector tube (101), may be advantageous in processes where intermediate product formation is taking place, such as for example TEOS deposition.

In embodiments, the feed entry may also be located towards the second end (126) of the injector tube (101) (not shown in the figures). In addition to providing improved mixing, this configuration may be advantageous in terms of temperature stabilization of the process gas, the process gas being the mixture of the precursor gases. This may further be advantageous for processes, where a longer path may be needed for the process gas to get thermally activated before being injected to the process chamber.

In a second aspect of the present disclosure, a semiconductor processing apparatus is disclosed. We now return to FIG. 6 representing schematically a semiconductor processing apparatus.

The semiconductor processing apparatus (300) may be suitable for processing a plurality of substrates (330). The plurality of substrates (330) may be comprised in a substrate boat (320) that may be receivable in a process chamber (310) of the apparatus (300) and that may be suitable for holding the plurality of substrates (330), where the process chamber (310) may be extending longitudinally in a vertical direction. The apparatus may further comprise a gas injector assembly (200) inside the process chamber (310). The gas injector assembly (200) may be suitable for providing a process gas into the process chamber (310).

The gas injector assembly (200) may comprise a gas injector. The gas injector may comprise an injector tube (101) suitable for injecting the process gas to the process chamber. The injector tube (101) may extend along a first axis in a longitudinal direction from a first end (125) to a second end (126). The gas injector may further comprise a feed end (104). The feed end (104) may comprise a first precursor gas inlet (109) and a second precursor gas inlet (108) for providing a first and a second precursor gas to the injector tube (101) to form the process gas.

The injector gas assembly (200) may further comprise a first precursor gas supply conduit (102) connecting the first precursor gas inlet (109) to a first gas entry and a second precursor gas supply conduit (103) connecting the second precursor gas inlet to a second precursor gas entry. A size of the first precursor gas supply conduit (102) extending from the first precursor gas entry to the first precursor gas inlet (109) may be larger than the size of the second precursor gas supply conduit (103) extending from the second precursor gas entry to the second precursor gas inlet (108).

In embodiments, the first and the second gas entry may refer to the entry points of each of the precursor gases into the respective conduits. Thus, the entry point of each of the precursor gas may be located outside the semiconductor processing apparatus (300). The entry points may thus be the point where each of the precursor gas conduits is connected to a precursor storage. In some embodiments, the first and the second gas entry may refer to the point of entry (102'; 103') of each of the conduits to the process chamber (310).

The semiconductor processing apparatus may advantageously allow for improving process yield. This may be due to the fact that thanks to the larger size of the first precursor gas supply conduit (102), first precursor gas may have extended time of exposure to the temperature of the process chamber before entering the feed end (104), thus improving its thermal activation. Improved thermal activation of the first precursor gas may improve the quality of the process gas formed upon mixing with the second precursor gas. This may then improve the film deposition process thereby, helping to improve process yield.

The larger size of the first precursor gas supply conduit (102) may refer to the diameter and/or the length of the first precursor gas supply conduit (102) being larger than diameter and/or the length of the second precursor gas supply conduit (103). Thus, at least one of the diameter and the length of the first precursor gas supply conduit (102) may be larger than at least one of the diameter and the length of the second precursor gas supply conduit (103).

In embodiments, at least a portion of the first precursor gas supply conduit (102) may be constructed with a plurality of elongated portions being connected to one another by substantially bowed portions. Thanks to the elongated portions, the length of the first precursor gas supply conduit (102) may be larger than the length of the second precursor gas supply conduit (103).

In some embodiments, the elongated portions may have the shape of a meander.

In some embodiments, the elongated portions may have the shape of a horse-shoe meander.

In some embodiments, the elongated portions may be in the shape of circular-shaped concentric loops or may be a spiral-shape looping downwards.

In some embodiments, the diameter of the first precursor gas supply conduit (102) may also be larger in addition to its larger length compared to the second precursor gas supply conduit (103).

In embodiments, the elongated portions (105) may be extending along the first axis (110) in the longitudinal direction. The at least portion (112) may extend between a first end (122) and a second end (123) along a second axis (119), the second axis (119) being perpendicular to the first axis (110).

In embodiments, the first end (122) of the at least portion (112) may be the end at which the first precursor gas enters into, in the direction of the flow of the first precursor gas so as to be injected to the process chamber, while the second end (123) may be the end at which the first precursor gas exits the at least portion (112).

In embodiments, the at least portion of the first precursor gas supply conduit (102) may be flush against an inner wall of the process chamber. This may advantageously allow for saving space inside the process chamber and reducing the risk for damage to the gas injector assembly particularly when substrate boat may be rotated.

In embodiments, the semiconductor processing apparatus (300) may be a vertical furnace.

In embodiments, the semiconductor processing apparatus (300) may be a vertical furnace suitable for forming a layer on a plurality of substrates by performing a chemical vapor deposition (CVD) process.

The substrate processing apparatus (300) may further comprise a controller being operably connected to the precursor gas supply conduits (not shown in the figures). The controller may be configured to execute instructions comprised in a non-transitory computer readable medium to cause the semiconductor processing apparatus to process the plurality of substrates. It is to be mentioned that the non-transitory computer readable medium does not include a mechanical switch.

The substrate processing apparatus (300) may further comprise a heater (350) to adjust and maintain a process temperature during the processing of the plurality of substrates. Furthermore, it may comprise a pressure controller (360) to adjust and maintain a process pressure during the processing of the plurality of substrates. The heater (350) and the pressure controller (360) may be operably connected to the controller.

The embodiments of the present disclosure do not limit the scope of invention as these embodiments are defined by the claims appended herein and their legal equivalents. Any equivalent embodiments are intended to be within the scope of this invention. Modifications of the disclosure that are different from one another, in addition to those disclosed herein, may become apparent to those skilled in the art. Such modifications and the embodiments originating therefrom, are also intended to fall within the scope of the claims appended herein.

The invention claimed is:

1. A gas injector assembly for providing a process gas to a process chamber of a semiconductor processing apparatus, the gas injector assembly comprising:

a gas injector comprising:

an injector tube for injecting the process gas to the process chamber of the semiconductor processing apparatus, the injector tube extending along a first axis in a longitudinal direction from a first end to a second end, and a feed end, proximate to the first end, comprising a first precursor gas inlet and a second precursor gas inlet for providing a first precursor gas and a second precursor gas, respectively, to the injector tube to form the process gas, a first precursor gas supply conduit connecting the first precursor gas inlet to a first precursor gas entry; and a second precursor gas supply conduit connecting the second precursor gas inlet to a second precursor gas entry, wherein a size of the first precursor gas supply conduit extending from the first precursor gas entry to the first precursor gas inlet is larger than the size of the second precursor gas supply conduit extending from the second precursor gas entry to the second precursor gas inlet.

2. The gas injector assembly according to claim 1, wherein at least a portion of the first precursor gas supply conduit is constructed with a plurality of elongated portions being connected to one another by substantially bowed portions.

3. The gas injector assembly according to claim 2, wherein the elongated portions extend along the first axis in the longitudinal direction and wherein the at least a portion of the first precursor gas supply conduit extends between the first end and the second end along a second axis, the second axis being perpendicular to the first axis.

4. The gas injector assembly according to claim 2, wherein the at least a portion of the first precursor gas supply conduit is meander-shaped.

5. The gas injector assembly according to claim 4, wherein the at least a portion of the first precursor gas supply conduit is a horse-shoe shaped meander.

6. The gas injector assembly according to claim 1, wherein the first precursor gas inlet and the second precursor gas inlet are positioned on the feed end at an angle of 180° or less with respect to one another.

7. The gas injector assembly according to claim 6, wherein the first precursor gas supply conduit or the second precursor gas supply conduit extends to a central axis of the feed end, the central axis being parallel to the first axis.

8. The gas injector assembly according to claim 6, wherein the first precursor gas inlet and the second precursor gas inlet are positioned on the feed end at an angle of 180° with respect to one another and wherein the first precursor gas inlet and the second precursor gas inlet face each other.

9. The gas injector assembly according to claim 1, wherein a diameter of the first precursor gas inlet for providing the first precursor gas is different than a diameter of the second precursor gas inlet for providing the second precursor gas.

10. The gas injector assembly according to claim 1, wherein the injector tube comprises a plurality of process gas injection holes for delivering the process gas into the process chamber, the process gas injection holes being spaced apart from one another in the longitudinal direction.

11. The gas injector assembly according to claim 10, wherein the plurality of process gas injection holes extend along a height of the injector tube.

12. The gas injector assembly according to claim 10, wherein the plurality of process gas injection holes have a pitch value decreasing along the first axis in the longitudinal direction from the first end to the second end.

13. The gas injector assembly according to claim 1, wherein the gas injector further comprises a mixing compartment, the mixing compartment comprising the feed end and being directly connected to the injector tube via a feed entry.

14. The gas injector assembly according to claim 13, wherein the feed entry is located near the first end of the injector tube or in between the first end and the second end of the injector tube.

15. A semiconductor processing apparatus for processing a plurality of substrates, comprising:

a process chamber extending longitudinally in a vertical direction, a substrate boat, receivable in the process chamber, for holding the plurality of substrates, and a gas injector assembly inside the process chamber, for providing a process gas into the process chamber, the gas injector assembly comprising:

a gas injector, the gas injector comprising:

an injector tube for injecting the process gas to the process chamber, the injector tube extending along a first axis in a longitudinal direction from a first end to a second end, and a feed end, proximate to the first end, comprising a first precursor gas inlet and a second precursor gas inlet for providing a first precursor gas and a second precursor gas, respectively, to the injector tube to form the process gas, a first precursor gas supply conduit connecting the first precursor gas inlet to a first precursor gas entry; and a second precursor gas supply conduit connecting the second precursor gas inlet to a second precursor gas entry, wherein a size of the first precursor gas supply conduit extending from the first precursor gas entry to the first precursor gas inlet is larger than the size of the second precursor gas supply conduit extending from the second precursor gas entry to the second precursor gas inlet.

16. The semiconductor processing apparatus according to claim 15, wherein at least a portion of the first precursor gas supply conduit is flush against an inner wall of the process chamber.

17. The semiconductor processing apparatus according to claim 15, wherein the semiconductor processing apparatus is a vertical furnace for forming a layer on the plurality of substrates by performing a chemical vapor deposition (CVD).

* * * * *